(12) United States Patent
Cheung et al.

(10) Patent No.: US 6,552,578 B1
(45) Date of Patent: Apr. 22, 2003

(54) POWER DOWN CIRCUIT DETECTING DUTY CYCLE OF INPUT SIGNAL

(75) Inventors: Jacky Hung-Yan Cheung, San Jose, CA (US); Hide Hattori, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/064,082

(22) Filed: Jun. 10, 2002

(51) Int. Cl.[7] .................................................. H03K 5/22
(52) U.S. Cl. ........................................ 327/26; 327/175
(58) Field of Search .......................... 327/18, 20, 23–30, 327/35–38, 60, 72, 89, 90, 175, 176, 291, 299, 561, 563

(56) References Cited

U.S. PATENT DOCUMENTS

| | | | |
|---|---|---|---|
| 3,624,410 A | 11/1971 | Bruckert | 307/234 |
| 4,197,508 A | 4/1980 | Takaoka | 328/140 |
| 4,399,412 A | 8/1983 | Rinaldi | 328/112 |
| 4,473,759 A * | 9/1984 | Mahabadi | 327/68 |
| 4,816,776 A | 3/1989 | Kessler | 331/49 |
| 4,882,545 A | 11/1989 | Plant | 328/138 |
| 5,095,280 A | 3/1992 | Wunner et al. | 328/63 |
| 5,107,523 A | 4/1992 | Heaney et al. | 377/2 |
| 5,175,751 A | 12/1992 | Heaney et al. | 377/2 |
| 5,642,063 A * | 6/1997 | Lehikoinen | 327/74 |
| 5,892,665 A | 4/1999 | Matsumoto et al. | 363/56 |
| 5,923,131 A | 7/1999 | Ishii | 315/370 |
| 5,949,261 A | 9/1999 | Field et al. | 327/156 |
| 5,973,569 A | 10/1999 | Nguyen | 330/298 |
| 6,147,528 A * | 11/2000 | O'Dowd et al. | 327/142 |
| 6,188,289 B1 * | 2/2001 | Hyeon | 331/17 |
| 6,307,412 B1 | 10/2001 | Kim et al. | 327/165 |
| 6,369,622 B1 * | 4/2002 | Lim et al. | 327/116 |

* cited by examiner

*Primary Examiner*—My-Trang Nuton
(74) *Attorney, Agent, or Firm*—Stuart T. Auvinen

(57) ABSTRACT

When the clock is stopped during a power-down mode, a clock duty-cycle detector asserts a power-down signal. The clock input is filtered to produce an average clock voltage over several clock periods. The average clock voltage is compared to an upper reference voltage to determine when the clock's duty cycle (high pulse-width percent) is above an upper limit. The average clock voltage is also compared to a lower reference voltage to determine when the clock's duty cycle is below a lower limit. When the clock's duty cycle is above the upper limit or below the lower limit the power-down signal is activated by logic. The logic disables the power-down signal when the clock's duty cycle is between the upper and lower limits. High-frequency clock glitches do not falsely trigger a power-up, since glitches are usually narrow and not sufficiently wide to reach the lower limit.

20 Claims, 4 Drawing Sheets

PRIOR ART
FREQ>FMIN
FALSE POWER-UP

POWER DOWN CIRCUIT DETECTING DUTY CYCLE OF INPUT SIGNAL

BACKGROUND OF INVENTION

This invention relates to integrated circuits (IC's), and more particularly to clock power-down detection.

Low-power and battery-operated electronic systems often are able to power down all or parts of the system to reduce power consumption. Subsystems can be partially powered down by stopping a clock input to the subsystem, or more fully powered down by asserting a power-down or enable input to the subsystem.

FIG. 1 shows a prior-art chip with separate clock and power-down inputs. Chip 10 could be a subsystem such as a memory, or part of a subsystem such as one memory chip on a memory module, or a network controller on a network card. A clock is input to chip 10, and a separate power-down signal is applied to an enable input (~EN) of chip 10. When the power-down signal is active (high), chip 10 is disabled and its power consumption is reduced. The clock to chip 10 may or may not be stopped.

Oftentimes the number of pins on a chip is limited, and using one of the few available pins for a power-down signal is undesirable. Sometimes the power-down condition can be detected by examining other pins. FIG. 2A shows detecting a stopped clock to power down a chip. Chip 10' includes frequency detector 12 which receives a clock input to chip 10', such as a general clock that is used elsewhere in chip 10'.

When the clock input to chip 10' is stopped, such as when the system wishes to reduce power for the subsystem containing chip 10', frequency detector 12 detects that the clock has stopped and activates an internal power-down signal. This internal power-down signal disables or shuts off various circuits in chip 10', reducing its power consumption. Frequency detector 12 may activate the internal power-down signal when the frequency of the clock input falls below a threshold frequency such as 1 kHz, 1 MHz, 10 Hz, or some other value.

A problem can occur when using a frequency detector to detect a slowed or stopped clock. Another nearby clock (NB_CLK) may have a metal trace or wire parallel to the clock input to chip 10' for a distance on a circuit board. When NB_CLK pulses and CLK_IN is off, a small voltage pulse may be capacitivly coupled into the clock input CLK_IN to chip 10'. FIG. 2B is a waveform showing capacitive coupling of a nearby clock trace that can cause false power-ups. When the nearby clock NB_CLK has a fast rising edge, a pulse can be coupled onto CLK_IN. If this pulse is sufficiently large, it can appear to the frequency detector as a clock pulse. When the frequency of the nearby clock is above the frequency detect threshold, chip 10' is falsely powered back up by these clock glitches.

To avoid having such small, brief glitches falsely triggering power-up, some filtering can be added to the detector. The frequency detector then requires a certain high pulse width before triggering power-up. FIG. 3A shows a filtered clock detector. Chip 16 receives a clock input CLK_IN, which is applied to the gate of transistor 22 in detector 12'. When the high pulse time of CLK_IN is sufficiently large, transistor 22 discharges capacitor 20 more rapidly than resistor 24 charges it back up. Then node PS falls below the threshold of buffer 18, causing buffer 18 to drive the internal power-down signal low (inactive). When the clock stops, transistor 22 remains off and resistor 24 charges capacitor 20 above the threshold of buffer 18, which then drives the power-down signal high (active).

FIG. 3B is a waveform showing power-down detection when the high pulse is too narrow. When CLK_IN has a high time greater than the minimum, TH>TH(min), then the power-down signal remains low as the transistor discharges the capacitor on node PS. However, as the high pulse width decreases further, it falls below the minimum width, and PS is not sufficiently discharged by the transistor. Node PS rises in voltage above the threshold of the buffer, VT, so that the buffer drives the power-down signal PD high to initiate power-down.

Some systems may power-down the clock by leaving it in the high state rather than the low state. In that case transistor 22 remains on, keeping node PS low and preventing buffer 18 from driving the power-down signal high. FIG. 3C is a waveform showing a failure to power down when the clock is held high. The clock input CLK_IN is slowed down or stopped in the high state rather than the low state. The high pulse width is nearly or all of the entire clock period, causing TH>TH(min) and meeting the requirement for detecting an active (running) clock. Node PS is discharged by the transistor during the clock-high time, and stays below threshold VT. The power-down signal remains inactive, and the chip does not power down as expected.

What is desired is a clock detector that detects when the clock stops in the high or low state. A clock detector is desired that detects when the clock's duty cycle is too high or too low and activates a power-down signal. A clock detector that does not falsely power-up a chip when glitches occur on a stopped clock line is desirable, regardless of whether the clock is stopped in the high or low state.

DETAILED DESCRIPTION

The present invention relates to an improvement in stopped-clock detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
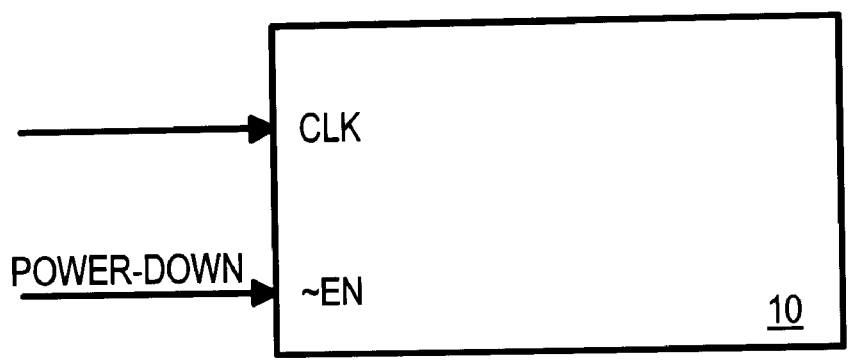
FIG. 1 shows a prior-art chip with separate clock and power-down inputs.
Figure 2A:
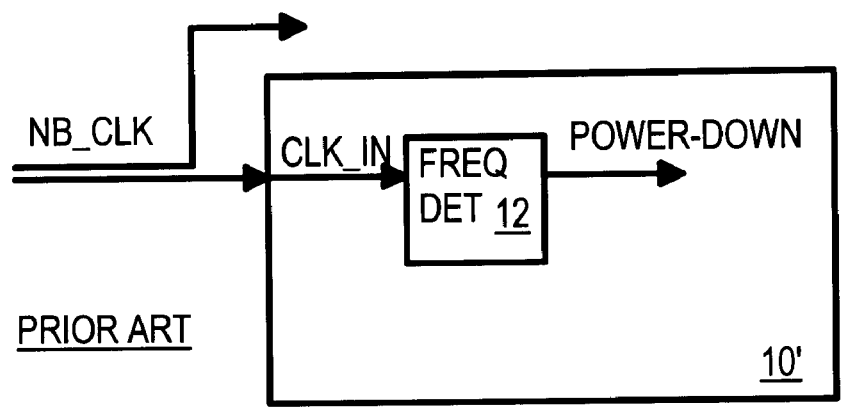
FIG. 2A shows detecting a stopped clock to power down a chip.
Figure 2B:
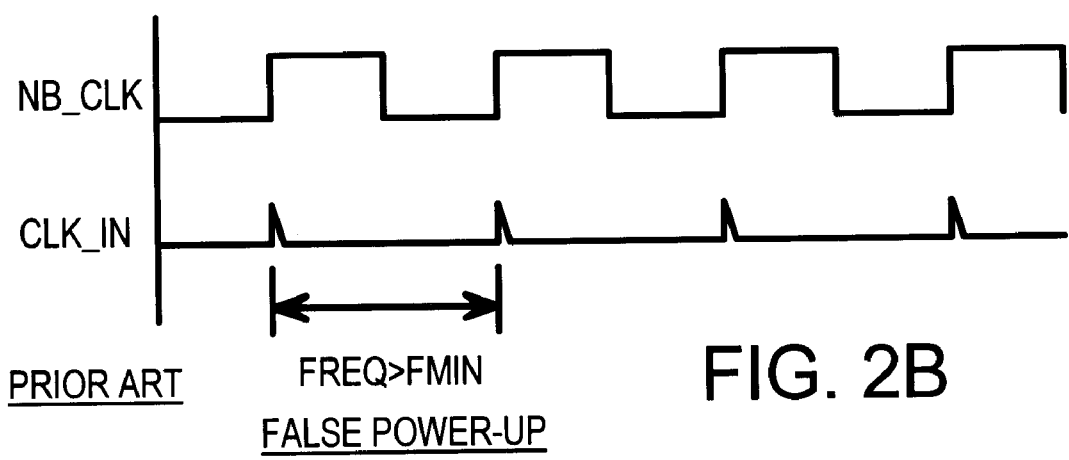
FIG. 2B is a waveform showing capacitive coupling of a nearby clock trace that can cause false power-ups.
Figure 3A:
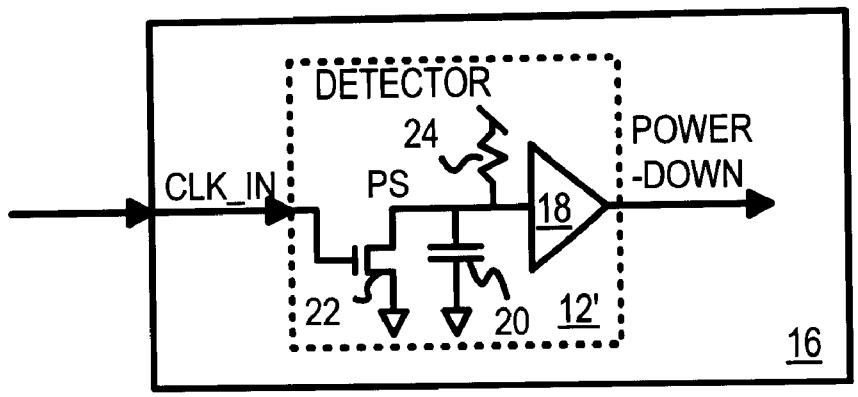
FIG. 3A shows a filtered clock detector.
Figure 3B:
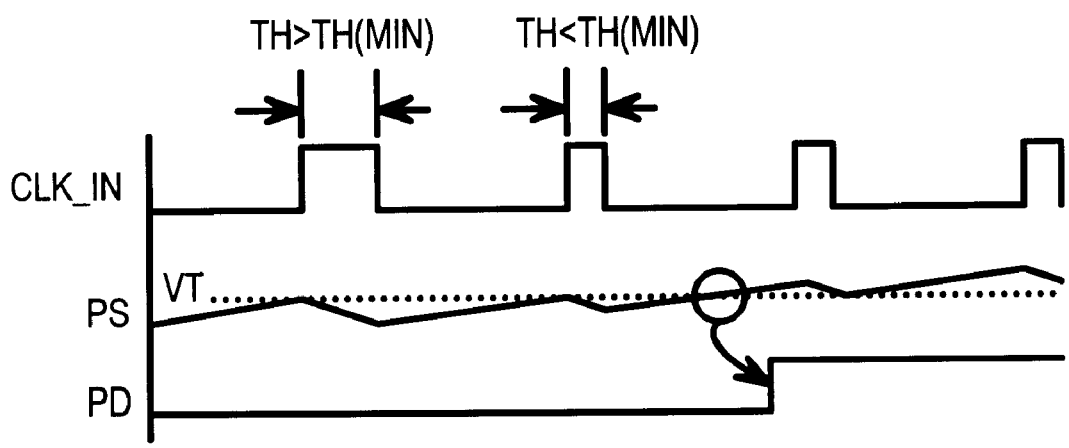
FIG. 3B is a waveform showing power-down detection when the high pulse is too narrow.
Figure 3C:
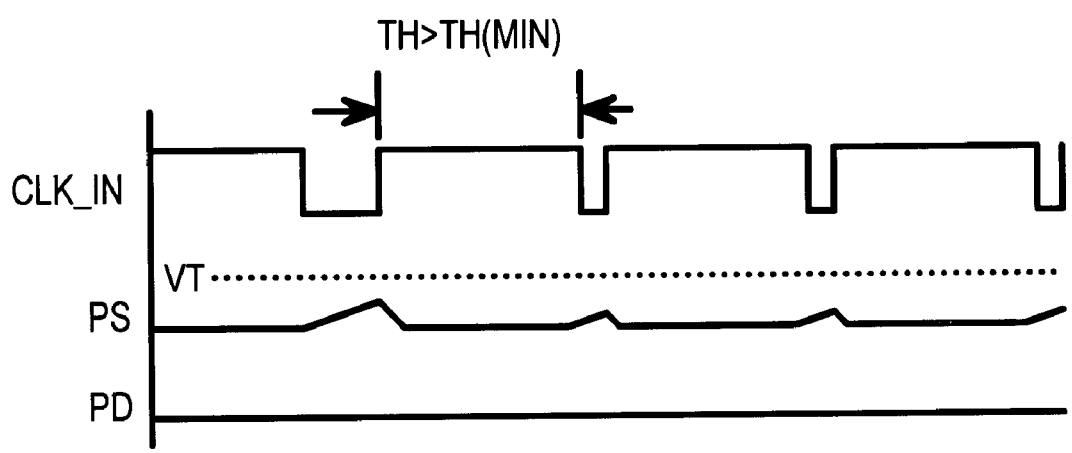
FIG. 3C is a waveform showing a failure to power down when the clock is held high.
Figure 4:
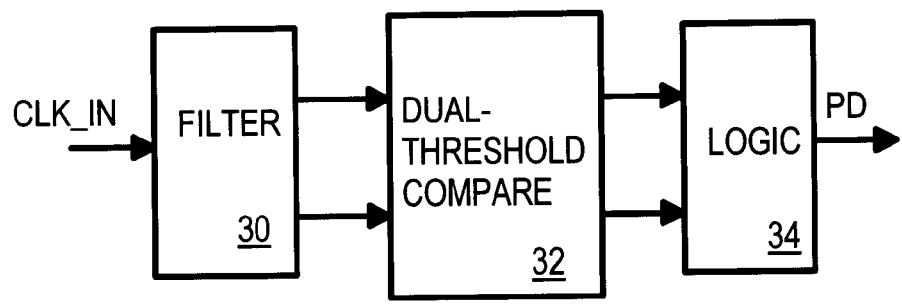
FIG. 4 shows a power-down detector that detects an out-of-range clock duty cycle.

FIG. 4 shows a power-down detector that detects an out-of-range clock duty cycle. An input clock CLK_IN to a chip is applied to filter 30 which smoothes or averages the clock's voltage over time, such as over many normal clock periods. One or more smoothed signals from filter 30 are input to dual-threshold comparator 32, which compares the filtered clock average to an upper threshold and to a lower threshold. Logic 34 then determines when the filtered clock average is above the upper limit or below the lower limit and activates power-down signal PD when the filtered average clock is outside the limits.

Figure 5:
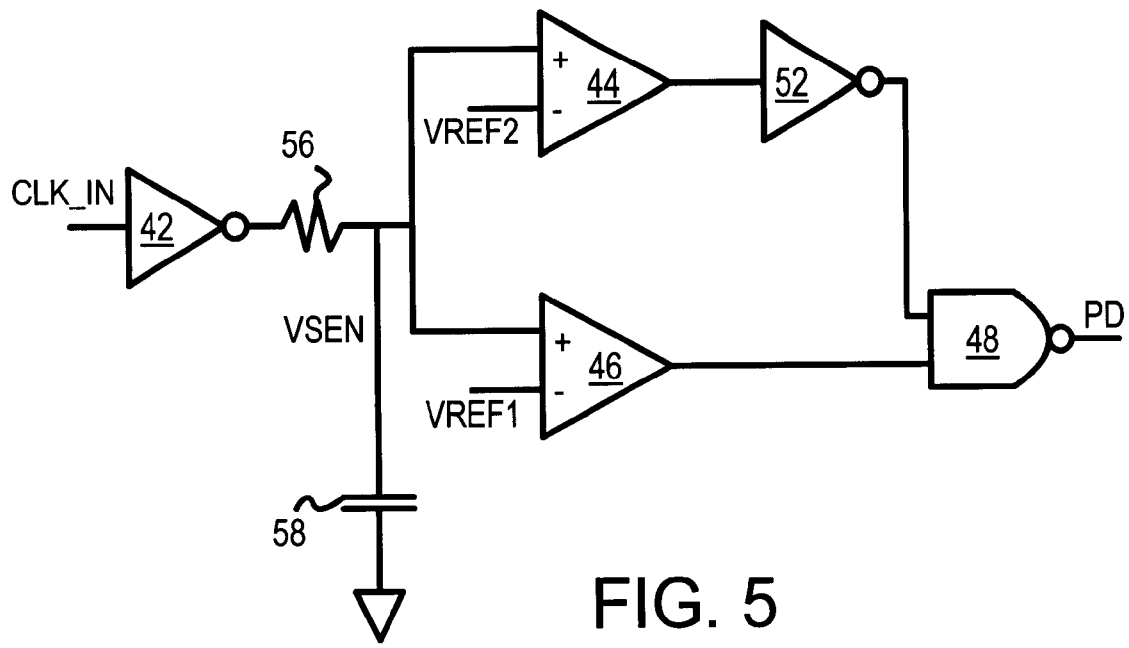
FIG. 5 is a schematic showing a dual-limit clock duty-cycle detector.

FIG. 5 is a schematic showing a dual-limit clock duty-cycle detector. An input clock is applied to inverter 42. The input clock may be stopped in either the high or low state, and glitches on the clock do not cause false power-ups since the glitches typically do not have a large enough pulse width even if they have a large voltage spike.

The output of inverter 42 charges and discharges capacitor 58 through series resistor 56. This filters the clock input, smoothing or averaging the clock's voltage over a time constant of about R*C. The averaged voltage on capacitor 58 is VSEN, and is applied to the non-inverting inputs of comparators 44, 46.

Comparator 44 compares VSEN to upper reference voltage Vref2 and outputs a high to inverter 52 when VSEN is above the upper voltage limit Vref2. This occurs when the high pulse width is above the high pulse limit or high duty cycle. Inverter 52 drives a low to NAND gate 48, causing NAND gate 48 to-drive power-down signal PD high when VSEN is above the upper limit.

Comparator 46 compares VSEN to lower reference voltage Vref1 and outputs a low to NAND gate 48 when VSEN is below the lower voltage limit Vref1. This occurs when the low pulse width exceeds the low pulse limit or low duty cycle. NAND gate 48 drive power-down signal PD high when VSEN is below the lower limit.

When the duty cycle of the input clock is between the upper and lower limits, comparator 44 outputs a low since VSEN is below the upper limit voltage Vref2, while comparator 46 outputs a high as VSEN is above the lower voltage limit Vref1. Inverter 52 inverts the low from comparator 44 and drives a high to NAND gate 48. Since both inputs to NAND gate 48 are high, NAND gate 48 drives power-down signal PD low. The chip containing or controlled by the power-down detector remains powered-up.

Figure 6A:
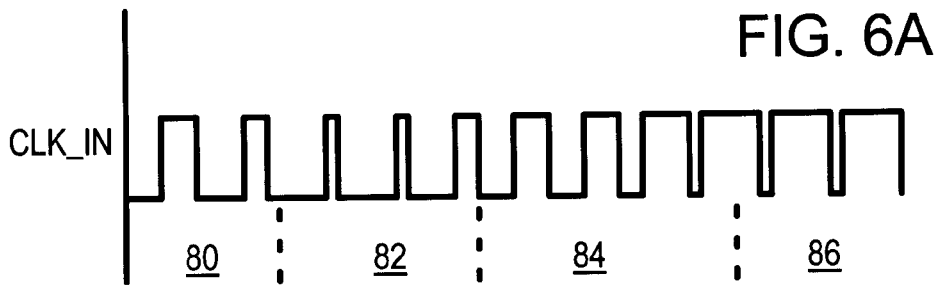
FIGS. 6A–C show waveforms of operation of the dual-limit clock duty-cycle detector.
Figure 6B:
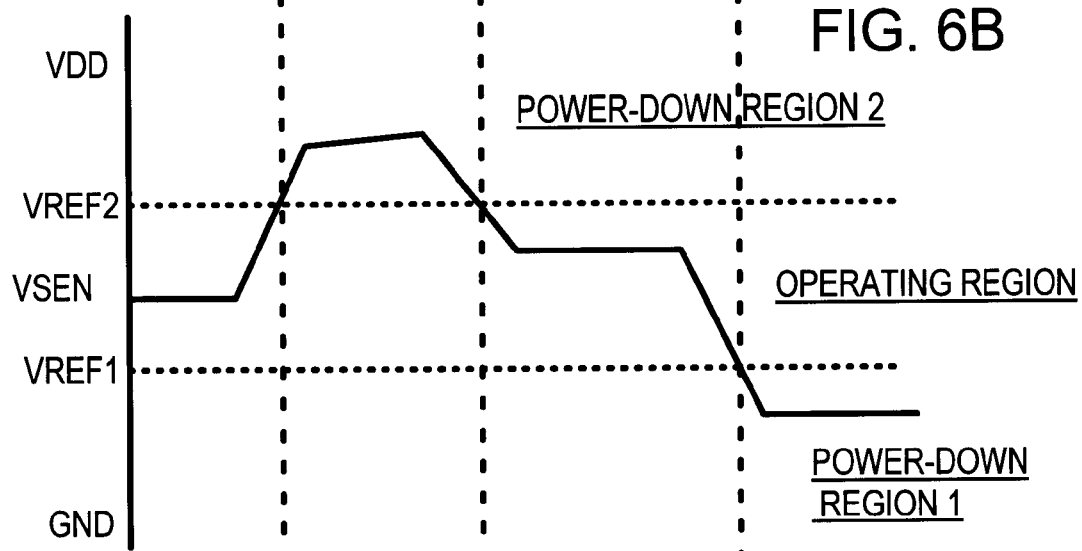
Figure 6C:
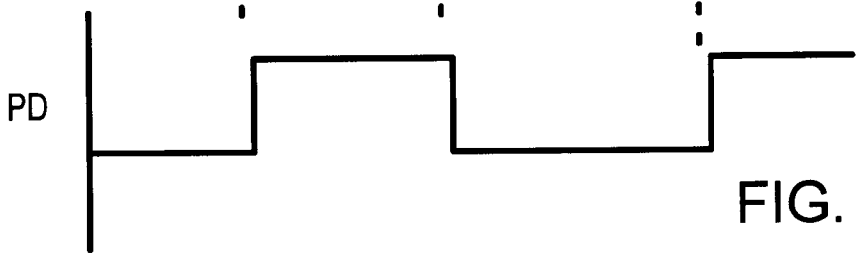

FIGS. 6A–C show waveforms of operation of the dual-limit clock duty-cycle detector. In FIG. 6A, the input clock CLK_IN has a typical duty cycle of about 50% during time 80, which is dramatically reduced during time 82, when the high pulse width is small, perhaps 10% of the cycle. During time 84 the clock high pulse width increases until time 86, when the high pulse width is large, and the duty cycle is 90%.

FIG. 6B shows that there are three regions of operation of the clock detector. When the clock duty cycle is low (small high pulse-width) the average clock voltage VSEN is above the upper voltage limit Vref2 and the power-down signal PD is activated. This power-down region occurs during time 82.

When the clock duty cycle is high (large high pulse-width) the average clock voltage VSEN is below the lower voltage limit Vref1 and the power-down signal PD is again activated. This power-down region occurs during time 86.

When the clock duty cycle is in the desired range, such as between 25% and 75%, the average clock voltage VSEN is between Vref1 and Vref2. For example, when the clock input is driven from ground to Vcc, and the duty cycle is 50%, the average clock voltage is Vcc/2. The power-down signal is de-activated (driven low) as shown in FIG. 6C. This normal operating regions occurs during times 80, 84.

ALTERNATE EMBODIMENTS

Several other embodiments are contemplated by the inventors. Additional logic gates, buffers, and latches can be added to the circuits shown. Signals can be inverted and gates adjusted using DeMorgan's theorem. Clock inputs not driven fully to Vcc and ground can also be used, and the reference voltages can be adjusted accordingly. The resistance and capacitance values in the filter can have a variety of values, depending on the clock frequency and number of clock periods to average. More complex filters can be used. Op amps can be used for comparators, such as for comparators 44, 46.

The clock input may be buffered or inverted before being applied to the detector, and the power down signal may be active high or active low, and may itself be buffered, inverted, and gated before being applied to various blocks. The inputs to a comparator can be reverse rather than use a separate inverter. The sub-system blocks powered down can be on the same substrate as the detector or can be include other chips as well. The clock input could come from an external clock or could be an internal clock. The detector can be designed for many possible desired duty cycles, such as 30%–70%.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §1.12, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A duty-cycle detector comprising:
   a clock input;
   a filter for averaging the clock input over at least one clock period to produce average clock voltage;
   a first comparator, receiving the average clock voltage from the filter and receiving a first reference voltage, and generating an upper-limit signal when the average clock voltage exceeds the first reference voltage;

a second comparator, receiving the average clock voltage from the filter and receiving a second reference voltage, and generating a lower-limit signal when the average clock voltage is below the second reference voltage; and logic that receives the upper-limit signal from the first comparator and the lower-limit signal from the second comparator, that generates a power-down signal when the lower-limit signal or the upper-limit signal is asserted, whereby the power-down signal is generated when the average clock voltage is above an upper limit or below a lower limit.

2. The duty-cycle detector of claim 1 wherein the filter comprises:

a buffer that receives the clock input and drives a first node;

a series resistor coupled between the first node and a second node;

a capacitor coupled to the second node;

wherein the second node is connected to the first and second comparators and carries the average clock voltage.

3. The duty-cycle detector of claim 2 wherein the buffer is an inverter.

4. The duty-cycle detector of claim 3 wherein the logic comprises:

an inverter, receiving the upper-limit signal from the first comparator, for generating an inverted upper-limit signal;

a logic gate that receives the inverted upper-limit signal from the inverter and the lower-limit signal from the second comparator and outputs the power-down signal.

5. The duty-cycle detector of claim 4 wherein the logic gate is a NAND gate and the power-down signal is an active-high signal.

6. The duty-cycle detector of claim 2 wherein the first comparator has an inverting input that receives the average clock voltage from the filter and a non-inverting input that receives the first reference voltage;

wherein the logic comprises:

a NAND gate that receives an active-low upper-limit signal from the first comparator and the lower-limit signal from the second comparator and outputs the power-down signal.

7. The duty-cycle detector of claim 6 wherein glitches on the clock input with a small pulse-width are filtered out by the filter and do not de-activate the power-down signal when a clock applied to the clock input is stopped.

8. The duty-cycle detector of claim 7 wherein the first reference voltage is at least 0.70*(Vclkh−Vclkl)+Vclkl wherein Vclkh is a high voltage of the clock and Vclkl is a low voltage of the clock;

wherein the second reference voltage is less than 0.30*(Vclkh−Vclkl)+Vclkl, whereby the power-down signal is not activated when the clock input has a duty cycle between 30% and 70%.

9. The duty-cycle detector of claim 7 wherein the clock has a high voltage of about a power-supply voltage and a low voltage of about ground, wherein the clock is a full-swing clock.

10. The duty-cycle detector of claim 7 wherein the first reference voltage is at least 0.70*Vcc wherein Vcc is a power-supply voltage;

wherein the second reference voltage is less than 0.30*Vcc, whereby the power-down signal is not activated when the clock input has a duty cycle between 30% and 70%.

11. A power-saving chip comprising:

a clock input that receives a clock from a system power controller, the clock being stopped when the system power controller places the power-saving chip into an idle mode;

a clock buffer that receives the clock from the clock input and drives a filter input;

a filter that receives the clock on the filter input from the clock buffer and generates a filtered clock;

a first comparator that receives the filtered clock from the filter and compares the filtered clock to a first reference and generates a first output;

a second comparator that receives the filtered clock from the filter and compares the filtered clock to a second reference and generates a second output; and combining logic that receives the first output from the first comparator and the second output from the second comparator and generates an power-down signal;

wherein the power-down signal is activated to power-down at least part of the power-saving chip when the filtered clock exceeds the first reference or the filtered clock is under the second reference, but the power-down signal is not activated when the filtered clock is between the first and second references, whereby power is reduced when the clock's duty cycle is outside of a range determined by the first and second references.

12. The power-saving chip of claim 11 wherein the filter comprises:

a series resistor coupled between the filter input and the filtered clock;

a capacitor coupled to the filtered clock.

13. The power-saving chip of claim 12 wherein the capacitor is coupled between the filtered clock and a ground.

14. The power-saving chip of claim 13 wherein the filtered clock is connected to non-inverting inputs to the first and second comparators and carries an average voltage of the clock.

15. The power-saving chip of claim 14 wherein the first reference is a first reference voltage applied to an inverting input of the first comparator and the second reference is a second reference voltage applied to an inverting input of the second comparator.

16. The power-saving chip of claim 15 wherein the combining logic includes an AND or a NAND gate that receives an inverted first output and the second output, or receives the first output and an inverted second output.

17. A duty-cycle-detecting power-down circuit comprising:

clock input means for receiving a clock that is stopped to signal a power-saving mode;

filter means for averaging the clock over several clock periods to produce an average clock voltage;

first compare means, receiving the average clock voltage from the filter means and receiving a first reference voltage, for activating an upper-limit signal when the average clock voltage exceeds the first reference voltage;

a second compare means, receiving the average clock voltage from the filter means and receiving a second reference voltage, for activating a lower-limit signal when the average clock voltage is below the second reference voltage; and logic means, receiving the upper-limit signal from the first compare means and the lower-limit signal from the second compare means, for activating a power-down signal when the lower-limit signal or the upper-limit signal is activated, whereby the power-down signal is generated when the average clock voltage is above an upper limit or below a lower limit.

18. The duty-cycle-detecting power-down circuit of claim 17 wherein the logic means comprises:

inverter means, receiving the upper-limit signal from the first compare logic, generating an inverted upper-limit signal;

logic gate means, receiving the inverted upper-limit signal from the inverter means and the lower-limit signal from the second compare logic, for generating the power-down signal as a logical combination of the inverted upper-limit signal and the lower-limit signal.

19. The duty-cycle-detecting power-down circuit of claim 18 wherein the logic gate means is a NAND gate and the power-down signal is an active-high signal or an AND gate and the power-down signal is an active-low signal.

20. The duty-cycle-detecting power-down circuit of claim 17 wherein the first compare means has an inverting input that receives the average clock voltage from the filter means and a non-inverting input that receives the first reference voltage;

wherein the logic means comprises:
NAND gate means, receiving an active-low upper-limit signal from the first compare means and the lower-limit signal from the second compare means, for generating the power-down signal.

* * * * *